(12) United States Patent
Wang et al.

(10) Patent No.: US 9,484,299 B2
(45) Date of Patent: Nov. 1, 2016

(54) SIGNAL LINE CONNECTION STRUCTURE AND APPARATUS USING THE SAME

(75) Inventors: Sheng Wang, Beijijng (CN); Lei Tang, Beijing (CN); Xin Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 146 days.

(21) Appl. No.: 13/425,728

(22) Filed: Mar. 21, 2012

(65) Prior Publication Data

US 2012/0242919 A1    Sep. 27, 2012

(30) Foreign Application Priority Data

Mar. 22, 2011    (CN) .......................... 2011 2 0077260

(51) Int. Cl.
*H01L 23/528*    (2006.01)
*G02F 1/1362*    (2006.01)
*G02F 1/1345*    (2006.01)

(52) U.S. Cl.
CPC .......... *H01L 23/528* (2013.01); *G02F 1/1345* (2013.01); *G02F 1/136204* (2013.01); *H01L 2924/0002* (2013.01)

(58) Field of Classification Search
CPC ................................. G02F 1/136204
USPC ........................................... 349/149
See application file for complete search history.

(56) References Cited

U.S. PATENT DOCUMENTS

| 5,781,253 A * | 7/1998 | Koike et al. .................... 349/40 |
| 6,859,351 B2 * | 2/2005 | Byrne et al. .................. 361/220 |
| 2006/0266544 A1 * | 11/2006 | Tung et al. .................... 174/250 |
| 2009/0065861 A1 * | 3/2009 | Bhalla ................ H01L 29/1095 257/331 |
| 2009/0200063 A1 * | 8/2009 | Omerovic .................... 174/250 |

* cited by examiner

*Primary Examiner* — Nathanael R Briggs
*Assistant Examiner* — Alexander Gross
(74) *Attorney, Agent, or Firm* — Ladas & Parry LLP

(57) ABSTRACT

The present disclosure relates to a signal line connection structure and apparatuses using the same. The signal line connection structure according to an embodiment of the present disclosure comprises a first signal line and a second signal line, one end of the first signal line and one end of the second signal line corresponding to each other and being connected through a conductive layer; and a first tip end arranged in the first signal line; and a second tip end arranged in the second signal line. The first tip end and the second tip end are arranged as opposed to but not connected with each other, and static charges in the first signal line and the second signal line are discharged through the first tip end and the second tip end.

11 Claims, 5 Drawing Sheets

SIGNAL LINE CONNECTION STRUCTURE AND APPARATUS USING THE SAME

BACKGROUND

The present disclosure relates to a signal line connection structure and apparatuses using the same.

The liquid crystal display (LCD) as an important flat display mode has been developing fast for more than ten years. The liquid crystal display carries the advantages of light weight, thinness and low power consumption, etc, and is broadly applied in modern information apparatuses such as televisions, computers, cell-phones, digital cameras and so on.

A liquid crystal (LC) panel generally comprises an array substrate, a color film substrate and a LC layer between the two substrates. The array substrate comprises a thin film transistor (TFT) circuit in the pixel area and a peripheral circuit in the peripheral area. The color film comprises red, green, and blue (RGB) resins and a black matrix. The displaying is realized through controlling the throughput of the light by controlling the ON-OFF of the TFTs to control the twist of the LC. The ON-OFF of the TFTs is controlled by signals. Typically, the controlling is obtained by introducing the signals into the TFTs in the pixel area through signal lines in the peripheral circuit.

As shown in FIG. 1A, in the schematic diagram for the connection of the signal lines in the peripheral circuit of an LCD device in prior art, a first signal line 11a and a second signal line 21a are overlapped partially, and a respective insulating protection layer exists in their middle and the outermost layers to insulate the signal lines from each other. Though holes 12a and 22a are created respectively in insulating layers of the first signal line 11a and the second signal line 21a, and then an Indium Tin Oxide (ITO) layer 4a is plated on the though holes. The first signal line 11a and the second signal line 21a are connected though the ITO layer 4a on the though holes 12a and 22a in order to conduct signals.

FIG. 1B is the cross section in the AA' direction in FIG. 1A, the array substrate comprises a glass substrate 1, protection layers 3 and 5. During the production process of the array substrate, static charges are easy to concentrate at the though holes 12a and 22a after the through holes are created in the insulating layers of the first signal line 11a and the second signal line 21a. When the ITO layer 4a is plated on the through holes, the static charges concentrated at the through hole 12a of the first signal line 11a and the through 22a of the second signal line 21a will be discharged through the ITO layer 4a, which would generate a large current to burn down the ITO layer 4a. As a result, the signal transmission in the first signal line 11a and the second signal line 21a is broken.

Two ways exit currently to prevent the circuit from being damaged by discharging of the static charges. The first way is to increase the resistance of the first signal line 11a and the second signal line 21a, such that the ITO layer 4a is protected though the method in which the discharging current is reduced by decreasing the voltage of the ITO layer 4a at the through holes. The other way as shown in FIG. 2 is to increase the area of the through holes, such that the partial voltage of the ITO layer 4a at the through holes is reduced by decreasing the contact resistance of the first signal line 11a and the second signal line 21a.

The above-mentioned two ways are able to protect the ITO layer by reducing the discharging of the static charges to some extent; however, if the static voltage is relatively high, the discharging of the static charges still occurs from time to time, and the ITO layer covered on the through holes is burned down, which makes the signal transmission of the first signal line and the second signal line broken.

SUMMARY

The present disclosure provides a signal line connection structure and apparatuses using the same with respect to the problem that the discharging of the static charges burns down the conductive layer covered on the through holes to make the signal transmission of the first signal line and the second signal line broken.

An aspect of the present disclosure provides a signal line connection structure comprising a first signal line and a second signal line, one end of the first signal line and one end of the second signal line corresponding to each other and being connected through a conductive layer, wherein the structure further comprises: at least one first tip end arranged in the first signal line; and at least one second tip end arranged in the second signal line, wherein the first tip end and the second tip end are arranged as opposed to but not connected with each other, static charges in the first signal line and the second signal line being discharged through the first tip end and the second tip end.

In an embodiment of the disclosure, a protection layer is arranged on the surfaces of the first signal line and the second signal line, the conductive layer connecting the first signal line to the second signal line by a through hole in the protection layer.

In an embodiment of the disclosure, the first signal line and the second signal line do not overlap each other.

In an embodiment of the disclosure, the first tip end and the second tip end are the same in shape.

In an embodiment of the disclosure, the first tip end are arranged in any one or more positions of the top, bottom, left, right or middle of the connection part of the through hole of the first signal line; and the second tip end is arranged in any one or more positions of the top, bottom, left, right or middle of the connection part of the through hole of the second signal line.

In an embodiment of the disclosure, the top of the first tip end is sawtooth-shaped or sword-shaped; and the top of the second tip end is sawtooth-shaped or sword-shaped.

In an embodiment of the disclosure, the first tip end and the second tip end do not overlap each other.

In an embodiment of the disclosure, the intersection between the bottom of the first tip end and the first signal line shows a round corner or an approximately round corner; and the intersection between the bottom of the second tip end and the second signal line shows a round corner or an approximately round corner.

Another aspect of the present disclosure provides an array substrate using the above-described signal line connection structure.

Further another aspect of the present disclosure provides an LCD using the above-described array substrate.

Because there is a tip end for discharging static charges respectively in the two signal lines in the signal line connection structure according to an embodiment of the present disclosure, it is possible to prevent the case in which the discharging of the static charges burns down the conductive layer covered on the through holes to make the signal transmission of the first signal line and the second signal line broken from occurring. As a result, the signal lines are protected better, and thus the performance and the stability of the transmission of the signal lines are improved.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

In an embodiment of the disclosure, the signal line connection structure comprises a conductive layer through which a first signal line and a second signal line are connected with and opposed to each other, and a first tip end arranged in the first signal line and a second tip end arranged in the second signal line. The static charges generated by the two signal lines can be discharged by the two tip ends which are opposed to but not connected with each other. As a result, the situation is avoided that the discharging of the static charges burns down the conductive layer covered on the through holes and then makes the signal transmission of the first signal line and the second signal line broken. Therefore, the signal lines are protected better, and the performance and the stability of the transmission of the signal lines are improved.

In an embodiment of the disclosure, the conductive layer can be a non-metal transparent conductive layer, such as an ITO layer and an Indium zinc oxide (IZO) layer, a metal layer or any other layers having a conductive characteristic.

In the implementation, the signal line connection structure in an embodiment of the disclosure can also be applied in an array substrate, and the array substrate using the signal line connection structure in an embodiment of the disclosure can also be applied in an LCD.

A further description to the embodiments of the present disclosure is made in detail, in conjunction with the drawings.

Figure 1A:
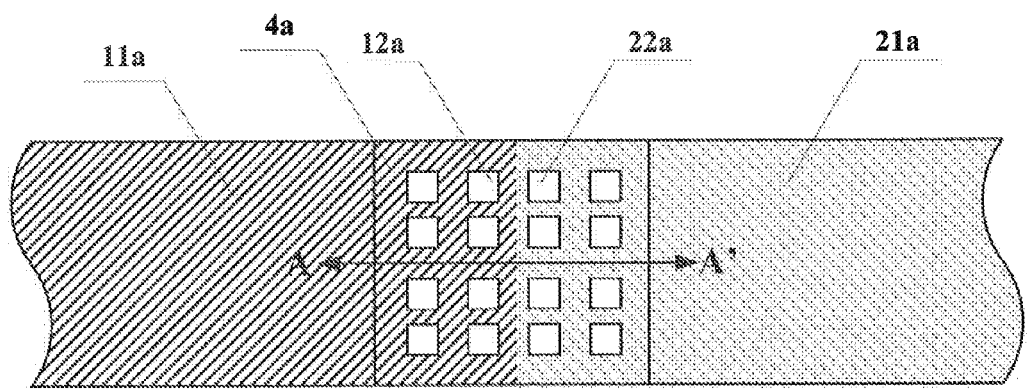
FIG. 1A is a schematic diagram of the connection of two signal lines by through holes in the peripheral circuit of an LCD device in prior art.
Figure 1B:
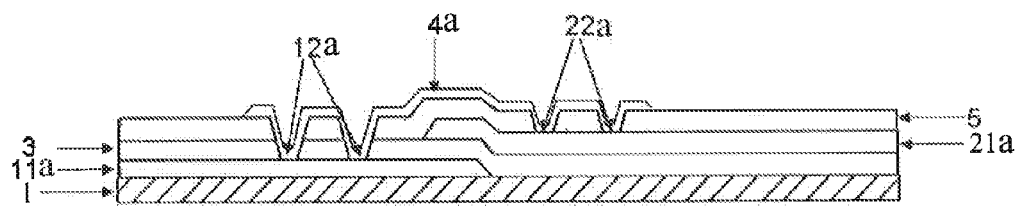
FIG. 1B is a cross-sectional view taken along line A-A' of FIG. 1A.
Figure 2:
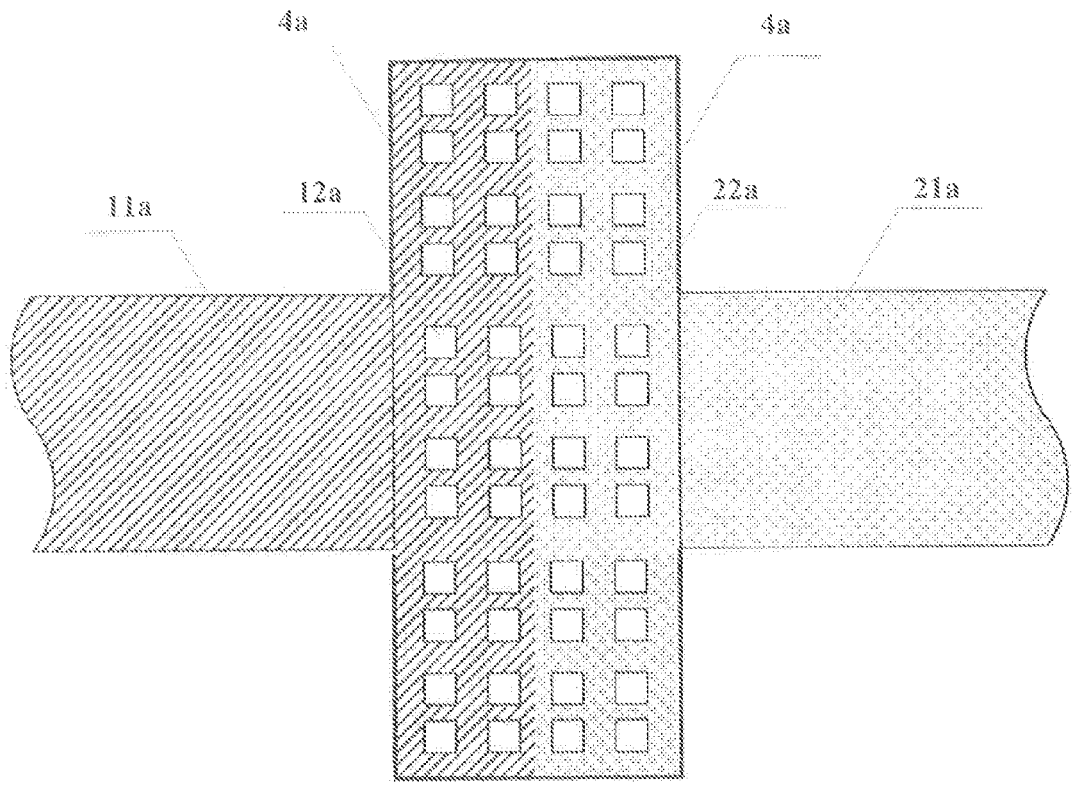
FIG. 2 is a schematic diagram for avoiding discharging at the through holes in an LCD device in prior art.
Figure 3:
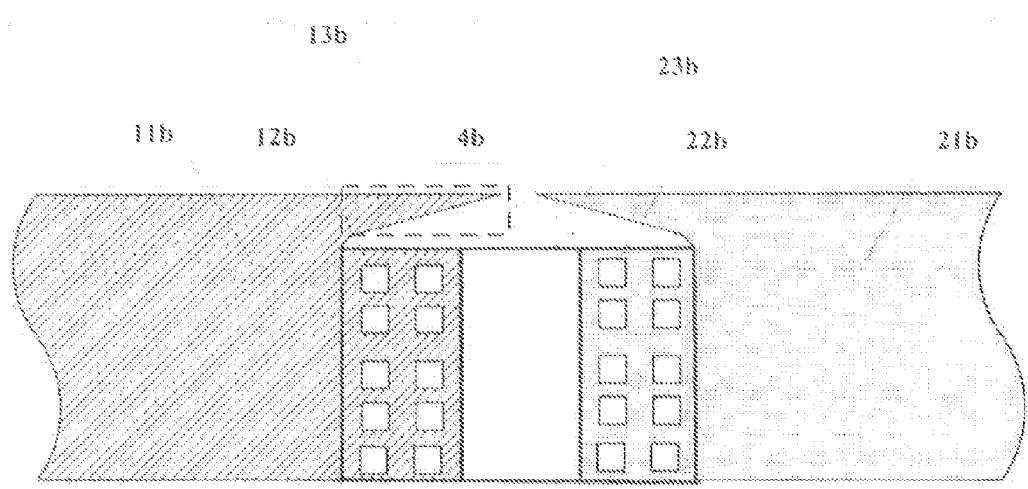
FIG. 3 is a schematic diagram of a first type of signal line connection structure according to an embodiment of the present disclosure.
Figure 4:
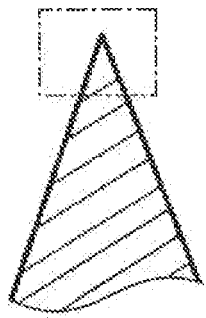
FIG. 4 is a schematic diagram of a first type of tip end according to an embodiment of the present disclosure.
Figure 5:
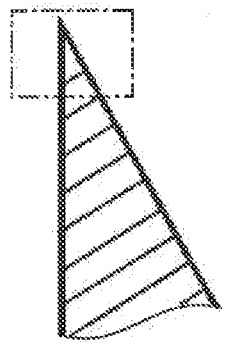
FIG. 5 is a schematic diagram of a second type of tip end according to an embodiment of the present disclosure.
Figure 6:
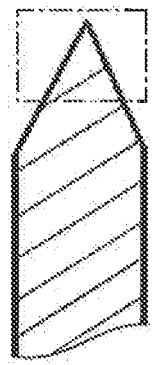
FIG. 6 is a schematic diagram of a third type of tip end according to an embodiment of the present disclosure.
Figure 7:
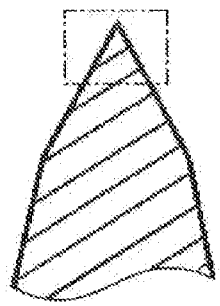
FIG. 7 is a schematic diagram of a fourth type of tip end according to an embodiment of the present disclosure.

As shown in FIG. 3, in the schematic diagram of the first type of signal line connection structure in an embodiment of the disclosure, one end of a first signal line 11b and one end of a second signal line 21b correspond to each other and are connected through a conductive layer 4b. At least one first tip end 13b is arranged in the first signal line 11b, and a least one second tip end 23b is arranged in the second signal line 21b. The first tip end 13b and the second tip end 23b are arranged as opposed to but not connected with each other. The static charges in the first signal line 11b and the second signal line 21b are discharged through the first tip end 13b and the second tip end 23b.

In an embodiment of the disclosure, the surfaces of the first signal line 11b and the second signal line 21b are arranged with respective protection layers. The conductive layer 4b connects the first signal line 11b to the second signal line 21b trough the through holes 12b in the protection layers.

The first signal line 11b and the second signal line 21b may or may not overlap each other. The first tip end 13b and the second tip end 23b may or may not overlap each other. The first tip end 13b and the second tip end 23b may not be positioned correspondingly. In an embodiment of the disclosure, the first tip end 13b and the second tip end 23b are positioned correspondingly.

In an embodiment of the disclosure, the distance between the first tip end 13b and the second tip end 23b meets the condition in which when the generated static charges make the two tip ends create a voltage that is able to burn down the conductive layers during the production process, the first tip end 13b and the second tip end 23b perform discharging; however, when the two tip ends create a voltage that is not able to burn down the conductive layers during normal operation of the display device, the first tip end 13b and the second tip end 23b do not perform discharging.

Because the first tip end 13b and the second tip end 23b may be connected with each other when performing discharging, in an embodiment of the disclosure, for the purpose of avoiding the influence of the connection by the discharging on the circuit, the first signal line 11b and the second signal line 21b do not overlap each other but are connected with each other through the conductive layer.

The shapes of the first tip end 13b and the second tip end 23b may or may not be the same. The shapes of the first tip end 13b and the second tip end 23b can include a plurality of shapes such as one of a sawtooth shape, a sword shape and a polygon.

If the polygon is a triangle, it includes but not limited to one of acute triangle, a right triangle and an obtuse angled triangle.

The number of sawteeth of the sawtooh shape may be plural, which can be determined as needed.

Figure 8:
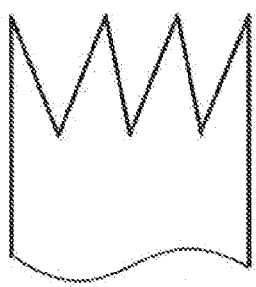
FIG. 8 is a schematic diagram of a sawtooth-shaped tip end according to an embodiment of the present disclosure.

For example, some embodiments of the shape of a tip end of the present disclosure are listed below, as shown within the frames with dotted lines in FIGS. 4-7 and in FIG. 8. The shape of a tip end according to the embodiments of the present disclosure may have one tip as shown in FIGS. 4-7, or may have multiple tips (i.e. the sawtooth) as shown in FIG. 8.

If the first tip end 13b and the second tip end 23b each have multiple tips, a multi-point discharging is realized due to the fact that the discharge can be performed between all the corresponding tips, thus improving the discharging effect of the static charges.

The first tip end 13b and the second tip end 23b according to the embodiments of the present disclosure may be in different combinations which can be applied in the embodiments of the present application as long as the static charges in the first signal line 11b and the second signal line 21b can be guaranteed to be discharged through the first tip end 13b and the second tip end 23b.

For instance, the first tip end 13b has one tip while the second tip end 23b has multiple tips; the first tip end 13b has multiple tips while the second tip end 23b has one tip; or, both the first tip end 13b and the second tip end 23b have multiple tips. But, the number of tips may be the same or different.

The number of the first tip end 13b and the second tip end 23b may be different. In an embodiment of the disclosure, the number of the first tip end 13b and the second tip end 23b is the same.

If more than one tip end is arranged in the same signal line, the shape of each tip end can be different. In an embodiment of the disclosure, the shape of every tip end is the same.

In order to prevent static charges from concentrating at the bottom of the tip ends, typically, in an embodiment of the present disclosure, the intersection between the bottom of the first tip end 13b and the first signal line 11b shows a round corner or an approximately round corner, and the intersection between the bottom of the second tip end 23b and the second signal line 21b shows a round corner or an approximately round corner.

The tip ends can be arranged near the connection parts of through holes of signal lines.

For example, the first tip end 13b is arranged in any one or more positions of the top, bottom, left, right or middle of the connection parts of through holes of the first signal line 11b.

The second tip end 21b is arranged in any one or more positions of the top, bottom, left, right or middle of connection parts of through holes of the second signal line 21b.

For example, if the first tip end 13b and the second tip 23b can be arranged at any two positions among the top, the bottom and the middle, there exit the following multiple combinations: the top and the bottom, the top and the middle, the bottom and the top, the bottom and the middle, the middle and the top, and the middle and the bottom.

The above described top includes one or more of the top left, the top right, and the very top.

The above described bottom includes one or more of the bottom left, the bottom right, and the very bottom.

The above described middle includes one or more of the middle left, the middle right, the middle top, the middle bottom, and the very middle.

In an embodiment of the disclosure, the first tip end 13b is positioned near the through hole of the first signal line 11b, and the second tip end 23b is positioned near the through hole of the second signal line 21b.

In FIG. 3, there is only one first tip end and one second tip end. Several embodiments with multiple tip ends are listed below.

Figure 9:
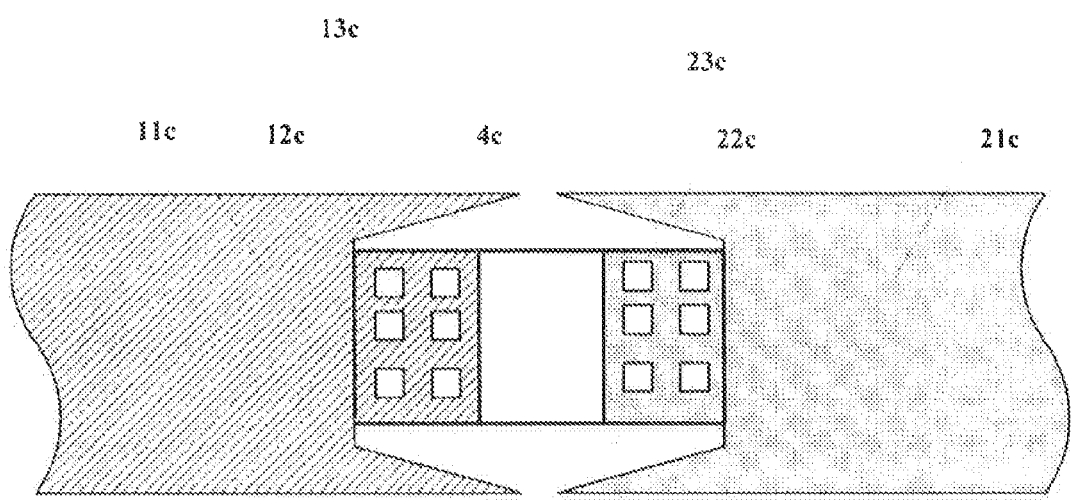
FIG. 9 is a schematic diagram of a second type of signal line connection structure according to an embodiment of the present disclosure.

As shown in FIG. 9, in the schematic diagram of the second type of signal line connection structure according to an embodiment of the present disclosure, through holes 12c are present in the protection layer of the first signal line 11c, through holes 22c are present in the protection layer of the second signal line 21c, a conductive layer 4c is plated on the through holes 12c and 22c, one end of the first signal line 11c and one end of the second signal line 21c correspond to each other and are connected through the conductive layer 4c, two first tip ends 13c are arranged in the first signal line 11c, two second tip ends 23c are arranged in the second signal line 21c, and the first tip ends 13c and the second tip ends 23c are arranged as opposed to but not connected with each other. The static charges in the first signal line 11c and the second signal line 21c are discharged through the first tip ends 13c and the second tip ends 23c.

Figure 10:
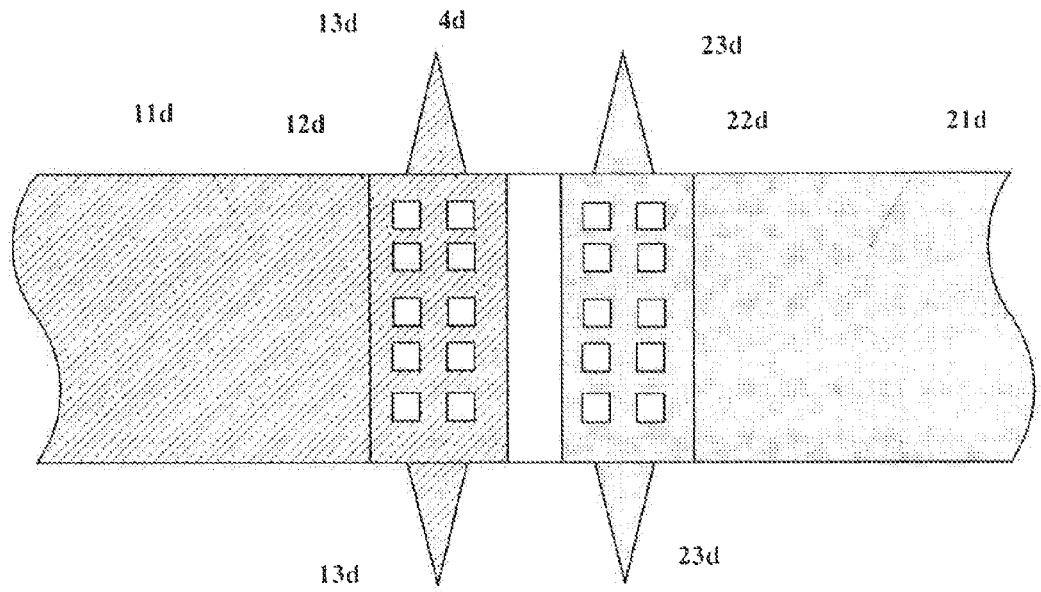
FIG. 10 is a schematic diagram of a third type of signal line connection structure according to an embodiment of the present disclosure.

As shown in FIG. 10, in the schematic diagram of the third type of signal line connection structure according to an embodiment of the present disclosure, through holes 12d are present in the protection layer of the first signal line 11d, through holes 22d are present in the protection layer of the second signal line 21d, a conductive layer 4d is plated on the through holes 12d and 22d, one end of the first signal line 11d and one end of the second signal line 21d correspond to each other and are connected through the conductive layer 4d, two first tip ends 13d are arranged in the first signal line 11d, two second tip ends 23d are arranged in the second signal line 21d, and the first tip ends 13c and the second tip ends 23c are arranged as opposed to but not connected with each other. The static charges in the first signal line 11d and the second signal line 21d are discharged through the first tip ends 13d and the second tip ends 23d.

An embodiment with one tip end being in the middle of each signal line and the shapes of the tip ends being different is described below.

Figure 11:
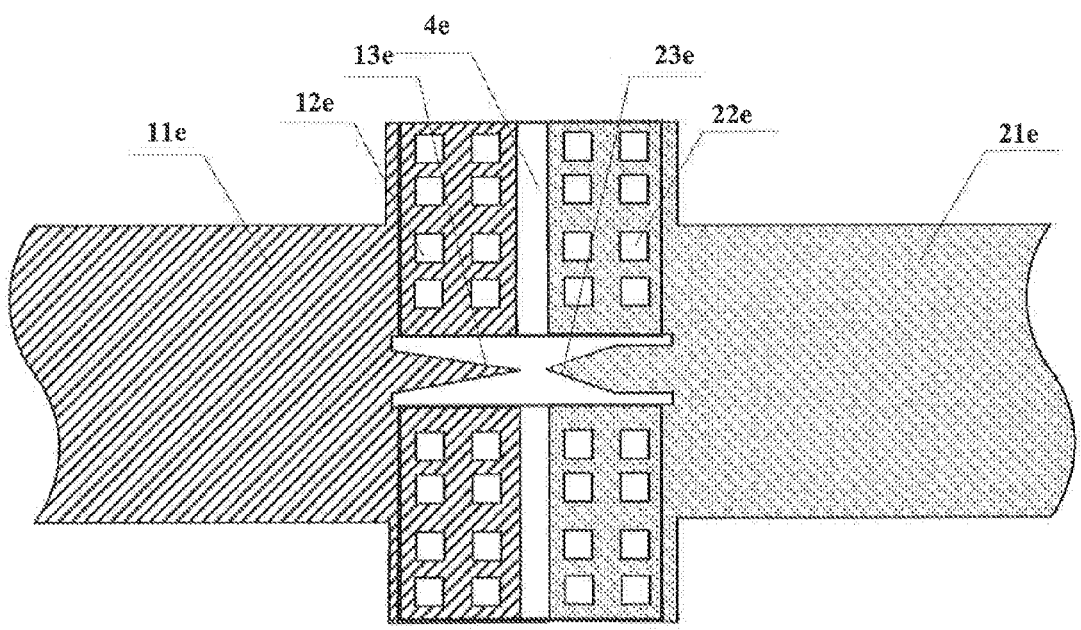
FIG. 11 is a schematic diagram of a fourth type of signal line connection structure according to an embodiment of the present disclosure.

As shown in FIG. 11, in the schematic diagram of the fourth type of signal line connection structure according to an embodiment of the present disclosure, through holes 12e are present in the protection layer of the first signal line 11e, through holes 21e are present in the protection layer of the second signal line 21e, a conductive layer 4e is plated on the through holes 12e and 22e, one end of the first signal line 11e and one end of the second signal line 21e correspond to each other and are connected through the conductive layer 4e, one first tip end 13e is arranged in the middle of the first signal line 11e, one second tip end 23e is arranged in the middle of the second signal line 21e, and the first tip end 13c and the second tip end 23c are arranged as opposed to but not connected with each other. The static charges in the first signal line 11e and the second signal line 21e are discharged through the first tip end 13e and the second tip end 23e.

In the above embodiments, one end of the first signal line correspond to one end of the second signal line, and the first signal line and the second signal line are aligned in a straight line. In the implementation, the first signal line and the second signal line can be laid at a certain angle.

Because there is a respective tip end for discharging static charges in the two signal lines in the signal line connection structure according to an embodiment of the present disclosure, it is possible to prevent the situation that the discharging of the static charges burns down the conductive layer covered on the through holes to make the signal transmission of the first signal line and the second signal line broken from occurring. As a result, the signal lines are protected better, and thus the performance and the stability of the transmission of the signal lines are improved.

It is obvious that those skilled in the art can make various modifications and changes to the present disclosure without departing from the spirit and scope of the present disclosure. Therefore, if those modifications and changes to the present disclosure fall within the scope of the claims of the present disclosure or equivalents thereof, the present disclosure is intended to include those modifications and changes.

What is claimed is:

1. A signal line connection structure used for liquid crystal displaying, comprising a first signal line and a second signal line, wherein the first signal line and the second signal line are arranged on different layers, one end of the first signal line is connected to a conductive layer via more than one first through hole, and one end of the second signal line is connected to the conductive layer via more than one second through hole, the structure further comprising:
    at least one first tip end arranged in the first signal line; and
    at least one second tip end arranged in the second signal line,
    wherein the first tip end and the second tip end are arranged as opposed to but not connected with each other, the first tip end is arranged near the first through hole, and the second tip end is arranged near the second through hole;
    wherein the first tip end has a plurality of cusps, and the second tip end has a single cusp, static charges accumulated at the first through hole and at the second through hole being discharged between the plurality of cusps of the first tip end and the single cusp of the second tip end;
    an intersection between a bottom of the first tip end and the first signal line shows a round corner; and
    an intersection between a bottom of the second tip end and the second signal line shows a round corner;
    wherein the first tip end and the second tip end are different in shape;
    a top part of the first tip end is a sawtooth-shape, and a top part of the second tip end is a sword-shape.

2. The signal line connection structure according to claim 1, wherein a protection layer is arranged on the surfaces of the first signal line and the second signal line, and the conductive layer connects the first signal line to the second signal line by a through hole in the protection layer.

3. The signal line connection structure according to claim 1, wherein the first signal line and the second signal line do not overlap each other.

4. The signal line connection structure according to claim 1, wherein the first tip end is arranged in any one or more positions of the top, bottom, left, right or middle of a connection part of a through hole of the first signal line; and
    the second tip end is arranged in any one or more positions of the top, bottom, left, right or middle of the connection part of the through hole of the second signal line.

5. The signal line connection structure according to claim 2, wherein the first tip end is arranged in any one or more positions of the top, bottom, left, right or middle of a connection part of the through hole of the first signal line; and
    the second tip end is arranged in any one or more positions of the top, bottom, left, right or middle of the connection part of the through hole of the second signal line.

6. The signal line connection structure according to claim 3, wherein the first tip end is arranged in any one or more positions of the top, bottom, left, right or middle of a connection part of a through hole of the first signal line; and
    the second tip end is arranged in any one or more positions of the top, bottom, left, right or middle of the connection part of the through hole of the second signal line.

7. The signal line connection structure according to claim 1, wherein the first tip end and the second tip end do not overlap each other.

8. The signal line connection structure according to claim 2, wherein the first tip end and the second tip end do not overlap each other.

9. The signal line connection structure according to claim 3, wherein the first tip end and the second tip end do not overlap each other.

10. An array substrate using the signal line connection structure according to claim 1.

11. A liquid crystal display using the array substrate according to claim 10.

* * * * *